(12) United States Patent
Chang et al.

(10) Patent No.: US 7,948,782 B2
(45) Date of Patent: May 24, 2011

(54) CONTENT ADDRESSABLE MEMORY REFERENCE CLOCK

(75) Inventors: Leland Chang, Yorktown Heights, NY (US); Gary S. Ditlow, Yorktown Heights, NY (US); Brian L. Ji, Chappaqua, NY (US); Robert K. Montoye, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 12/549,772

(22) Filed: Aug. 28, 2009

(65) Prior Publication Data

US 2011/0051486 A1    Mar. 3, 2011

(51) Int. Cl.
*G11C 15/00* (2006.01)
(52) U.S. Cl. .................. 365/49.17; 365/210.1; 365/49.1
(58) Field of Classification Search .............. 365/49.17, 365/210.1, 49.1, 233.1, 205
See application file for complete search history.

(56) References Cited

U.S. PATENT DOCUMENTS

| 5,018,111 | A | 5/1991 | Madland |
| 7,304,885 | B2 | 12/2007 | Cho et al. |
| 7,319,608 | B2 | 1/2008 | Hsu et al. |
| 7,417,888 | B2 | 8/2008 | Seshadri et al. |
| 7,502,245 | B2 * | 3/2009 | McKenzie et al. ......... 365/49.17 |
| 2008/0212363 | A1 | 9/2008 | Fuji |
| 2009/0003033 | A1 | 1/2009 | Nirschl |

* cited by examiner

*Primary Examiner* — David Lam
(74) *Attorney, Agent, or Firm* — Cantor Colburn LLP; Vazken Alexanian

(57) ABSTRACT

A memory system includes a content addressable memory (CAM) including a plurality of match lines, each match line having a plurality of memory cells coupled thereto. The system also includes a match detector coupled to the CAM and a reference match line having a plurality of reference memory cells coupled thereto, the reference memory cells being of the same type and the memory cells. The system also includes a match line sensor coupled to the reference match line and the match detector that determines a characteristic of the reference match line and provides a timing signal to the match detector based on the characteristic.

20 Claims, 5 Drawing Sheets

CONTENT ADDRESSABLE MEMORY REFERENCE CLOCK

BACKGROUND

The present invention relates to memory devices, and more specifically, to content addressable memory devices.

Random access memory (RAM) associates data with an address. Volatile RAMs such as dynamic RAM (DRAM) and static RAM (SRAM) are traditionally used in today's computers. However, as wireless mobile computing systems become more popular, intensive research and development in the memory area is now focusing on new non-volatile memories. Important non-volatile RAMs known today are ferroelectric RAM (FeRAM) using non-linear capacitance due to different polarization of the lead-zirconium-titanate (PZT) material, magnetic RAM (MRAM) using the magneto-resistance changes with magnetic polarity, and Chalcogenide phase change materials using resistance changes in ordered (conductive) and disordered (resistive) phases.

Content-addressable memory (CAM) is a special type of computer memory used in certain very high speed searching applications. It is also known as associative memory or associative storage. Most existing CAM products are volatile technologies based on SRAM or DRAM cells. CAMS using a resistance-change memory element such as, for example, Chalcogenide phase change materials, have been found to allow for density improvements in the formation of a CAM.

Unlike standard computer memory (e.g., RAM) in which the user supplies a memory address and the RAM returns the data word stored at that address, a CAM is designed such that the user supplies a data word and the CAM searches its entire memory to see if that data word is stored anywhere in it. If the data word is found, the CAM returns a list of one or more storage addresses where the word was found (and in some architectures, it also returns the data word, or other associated pieces of data). Thus, a CAM is the hardware embodiment of what in software terms would be called an associative array.

Binary CAM is the simplest type of CAM which uses data search words comprised entirely of 1s and 0s. Ternary CAM (TCAM) allows a third matching state of "X" or "Don't Care" for one or more bits in the stored dataword, thus adding flexibility to the search. For example, a ternary CAM might have a stored word of "10XX0" which will match any of the four search words "10000", "10010", "10100", or "10110".

SUMMARY

According to one embodiment of the present invention, a memory system that includes a content addressable memory (CAM) including a plurality of match lines, each match line having a plurality of memory cells coupled thereto is provided. The system also includes a match detector coupled to the CAM, a reference match line having a plurality of reference memory cells coupled thereto, the reference memory cells being of the same type and the memory cells and a match line sensor coupled to the reference match line and the match detector that determines a characteristic of the reference match line and provides a timing signal to the match detector based on the characteristic.

According to another embodiment of the present invention, a method of operating a content addressable memory (CAM) is provided. The method of this embodiment includes providing a search string to the CAM; providing a reference value to a reference match line; monitoring a characteristic of the reference match line; and sampling the CAM after the characteristic meets a predetermined value.

According to yet another embodiment of the present invention, a method of generating a timing signal for a content addressable memory (CAM) by utilizing a reference match line is disclosed. The method includes determining a first resistance level of the CAM in a first state; determining a second resistance level of the CAM in a second state; programming memory cells coupled to the reference match line such that the reference match line has a resistance level between the first resistance level and the second resistance level; and generating the timing signal when a monitored characteristic of the reference match line meets a predetermined value.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
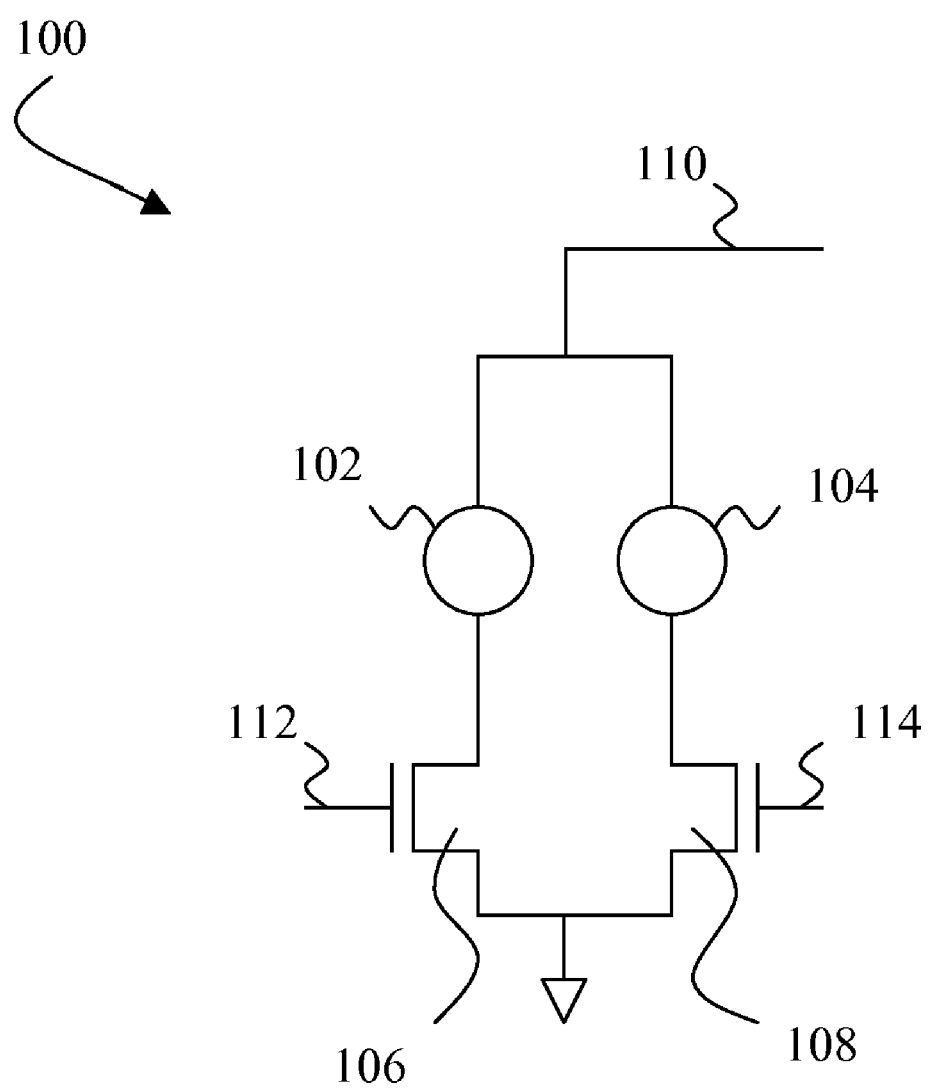
FIG. 1 shows an example of a memory cell for use in a CAM.

An example of a memory cell 100 for use in a CAM is shown in FIG. 1. The memory cell 100 shown in FIG. 1 may be a ternary CAM cell in one embodiment. The memory cell 100 includes a first memory element 102 and a second memory element 104. The first resistive memory element 102 and second memory element 104 are electrically coupled in parallel to a match line 110. The match line 110 may also be utilized as a bit-line in some embodiments. The first memory element 102 and the second memory element 104 may be formed as, for example, a phase change memory element. Phase change material can be utilized to store information in CAM devices and, accordingly may be used as the memory elements in some embodiments. Phase change materials can be manipulated into different phases or states, with each phase representing a different data value. Generally, each phase exhibits different electrical properties. The amorphous and crystalline phases are typically two phases used for binary data storage (1's and 0's) since they have detectable differences in electrical resistance. In a particular configuration of the invention, the first and second memory elements are phase change elements comprised of a phase change material, such as Germanium-Antimony-Tellurium (GST). The memory elements may be programmed to one of two states: a crystalline state or an amorphous state. In the crystalline state (SET), the memory elements exhibit relatively low resistances and require less current to be programmed to.

On the other hand, in the amorphous state (RESET), the memory elements have relatively high resistances and require more current to be programmed to. The resistance states of the first and second memory elements are used to store a data bit in a data word. For example, to store a data bit with a low ternary data value, the first memory element is programmed to the low resistance state and the second memory element is programmed to the high resistance state.

Other possibilities for the memory elements include, but are not limited to, resistive memory elements, floating gate field effect transistors (floating gate FETs), Magnetoresistive Random Access Memory (MRAMs), or a charge trapping device.

The memory cell 100 includes a first access device 106 electrically coupled to the first memory element 102, a first access line 106 and a common ground. The memory cell 100 also includes a second access device 108 electrically coupled to the second memory element 108, a second access line 114, and the common ground. The first access device 106 and the second access device 108 may be comprised of, but not limited to, field effect transistors (FET), or bipolar junction transistors (BJT). In one configuration of the invention, the access devices 108 and 110 include source, drain and common terminals. The source terminals of the access devices 106 and 108 are electrically coupled together and to the common ground. The drain terminal of the first access device 106 is electrically coupled to the first memory element 102. The drain terminal of the second access device 108 is electrically coupled to the second memory element 104. The gate terminal of the first access device 106 is electrically coupled to the first access line 114, which functions as the word line during the data storage operation. During a search operation, the first access line also functions as the complementary search line. The gate terminal of the second access device 104 is electrically coupled to the second access line 114, which functions as the complementary word line during the data storage operation and as a search line during a search operation.

As shown the memory cell 100 may have 4 possible states based on the programming of the first memory element 102 and second memory element 104. These combinations are RR, Rr, rR, and rr where R is high resistance and r is a low resistance. These combinations may be used to create the states shown below in Table 1 where the cell state X is the so called "don't care" state.

TABLE 1

| Cell State | First Element Resistive State | Second Element Resistive State |
|---|---|---|
| X | High | High |
| 0 | High | Low |
| 1 | Low | High |

In operation, to read (also referred to as matching) the state of the memory cell 100, the match line 110 is first precharged. Next, a particular value (x, 0, or 1) is applied to the first access line 112 and the second access line 114. In most cases, the first access line 112 forms the complement of the second access line 114. That is, if "a" is applied to the second access line 114, a value of "a*" (the complement of a) is applied to the first access line 112. This may be referred to as complementary addressing herein.

To compare the value stored in the cell to a logical "0", the first access line 112 is driven high and the second select line 114 is driven low. To compare the value stored in the cell 100 to a logical "1" the first select line 112 is driven low and the second select line 114 is driven high. In the case that the comparison to be made is a with a "don't care," the values placed on the select lines are irrelevant because both resistors are high valued and will keep the resistance of the match line resistance high.

When the value stored in the cell 100 does not match, the resistance level of the match line 110 falls. For example, assuming that cell 100 is storing a value of 1, the first memory element 102 is in a low resistance state and the second memory element 104 is in a high state. Application of a logical 0 to the access lines (first access line 112 high, second access line 114 low) opens the first access device 106 and, because the first resistor 102 is in a low resistance state, reduces the resistance level of the match line. This lower resistance indicates that a match has not been found.

Of course, in most instances, many cells are connected to a particular match line 110. If one of the cells does not match the value of the bit provided to it on the access lines 112 and 114, the resistance level of the match line 110 falls. Thus, it may be determined if any cell is not matched by monitoring the resistance level of the match line 110.

Figure 2:
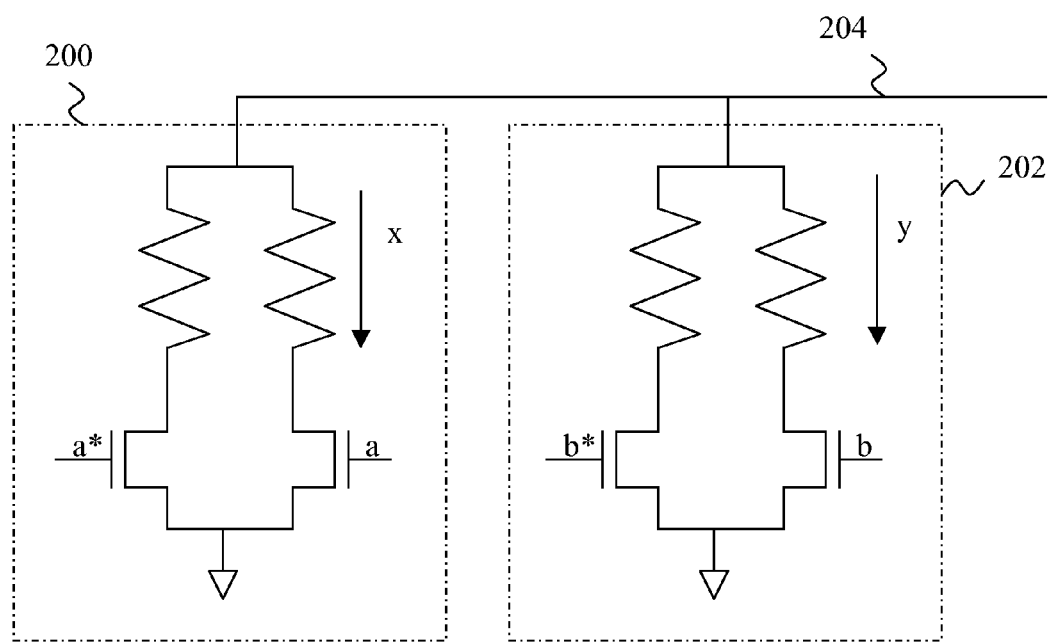
FIG. 2 shows an example of two memory cells coupled to a match line.

FIG. 2 shows an example of two CAM cells that may be addressed individually. The first cell 200 and second cell 202 are both connected to match line 204. Each cell includes two memory elements shown as resistors to emphasize the resistive properties of the memory elements in one embodiment. In the event that a match between the inputs and the bit stored for both cells 200 and 202 occurs, a pathway through a high resistance resistor from the match line 204 to ground is created in each cell.

As more cells are coupled to the match line 204, the resistive value of the match line decreases for a match condition because the resistors are in parallel for the match condition. For example, two arbitrary examples are shown with pathways x and y in FIG. 2. In short, one of two pull down paths are active for each 1 bit cell coupled to the match line 204 for every matching cell.

From the above description, it will be apparent that each time a cell matches the inputs it is receiving, the cell provides a path through a high resistance state resistive element to ground. Sensing a match or no match condition becomes much more sensitive to individual variations in the on/off ratio of the memory elements. This may be particularly true in the case when a PCM is used as the memory element. It shall be understood that the following description refers to a ternary CAM using PCM memory elements but could be applied to any CAM utilizing any type of memory element.

Figure 3:
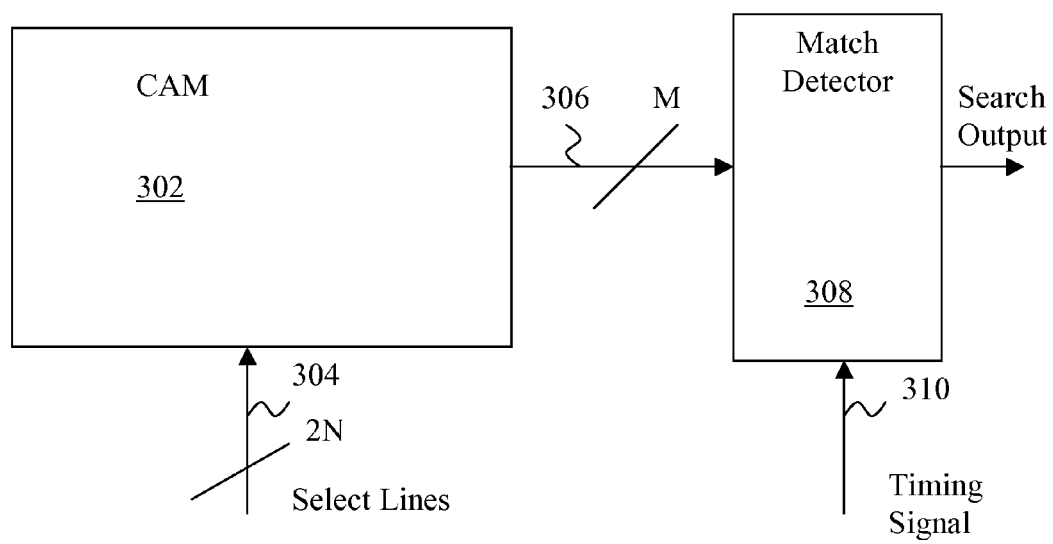
FIG. 3 shows a system for sensing a match condition in a CAM.

FIG. 3 shows a system 300 for sensing a match condition in a CAM. The system 300 includes a CAM 302. The CAM 300 may include M rows of memory cells, each row being coupled to a different match line and being N bits wide. The CAM is searched by applying a search vector on the select lines 304. Each bit of a particular row includes 2 select lines in the event that a cell such as that shown in FIG. 1 is utilized in the CAM 302. Accordingly, the CAM may include select lines 304 that provide an N-bit wide input vector.

As discussed above, the determination that of a match/no match condition may include monitoring the resistance of match lines 306. This resistance may be monitored by utilizing either a current or voltage sensing tools. To this end, in operation, the match lines 306 are precharged to a charge level. The voltage of the match line 306 is then sampled at a sample time some predetermined time after the match line 306 has been charged. Of course, the voltage on the match line 306 decays in a manner that is proportional to its resistance. Depending on the voltage level at the sample time, the match line 306 either shows a match (high voltage) or a non-match (low voltage). Of course, current (and thus resistance) could also be used to determine a match condition. In the event that current is used, a match is indicated by low current and a mis-match is indicated by a high current flowing in the match line 306.

Regardless of whether current or voltage sensing is utilized, the sampling and match determination may be performed by a match detector 308 coupled to the match lines 306 of the CAM 302. The match detector 308 receives a timing signal 310 that determines when the match detector 308 samples the match lines. The match detector 308 may include a sense-amp (either voltage or current) for each match line 306 and an associated latch.

However, it has been discovered that having an independent constant timing signal 310 may not take into account variability in PCM operating characteristics as the operating characteristics of the CAM 302 vary. For example, as temperature or operating voltage of the CAM 302 changes, the resistance of the PCM materials may vary. As this resistance varies, the voltage or current levels will also change. In addition, the rate of current or voltage decay may vary based on changes of the resistance.

Accordingly, in one embodiment of the present invention, a reference match line is used, in combination with the timing signal to produce a condition dependent timing signal to the sense amps. Stated differently, a reference match line may be used to drive the sample time of the match detector. In one embodiment, the match line is formed in the same manner as the CAM. The match line may then be programmed such that it has an effective resistance between a match value and a non-match value of the CAM. In a particular embodiment, the resistance of the reference match line is between a theoretical lowest resistance match condition and a theoretical highest resistance non-match condition. As one of ordinary skill in the art will realize, such a match line will have a decay time that is between the decay time of the two conditions. Utilizing such a line as part of a timing circuit will move the sample time between the two conditions. In one embodiment, the reference match line is formed of the same material as (and may be on the same chip as) the CAM and, accordingly, will react to external conditions in the same manner as the CAM. Thus, as operating conditions change for the CAM, so does the match line.

Figure 4A:
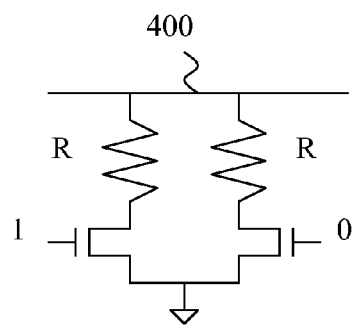
FIGS. 4A-4C show, respectively, a configuration of the lowest resistance match on a match line, a reference line according to an embodiment of the present invention, and a highest resistance non-match on a match line.
Figure 4B:
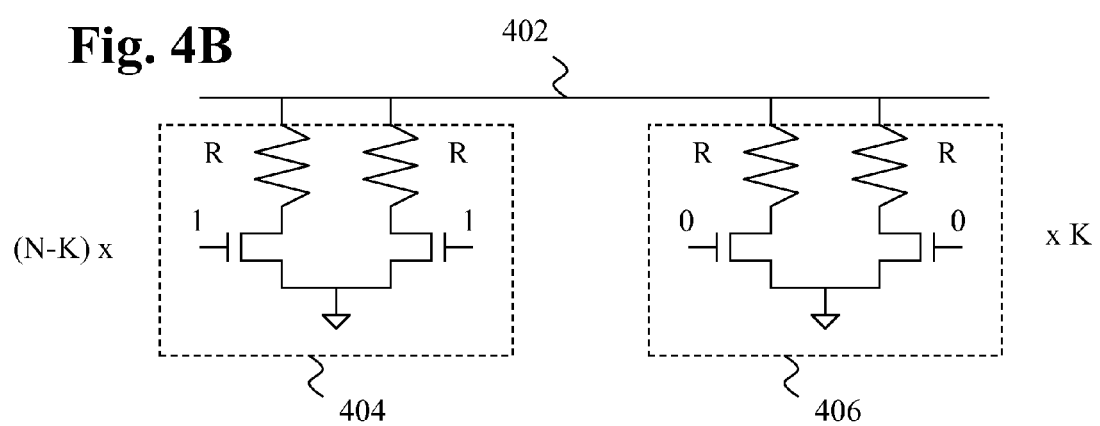
Figure 4C:
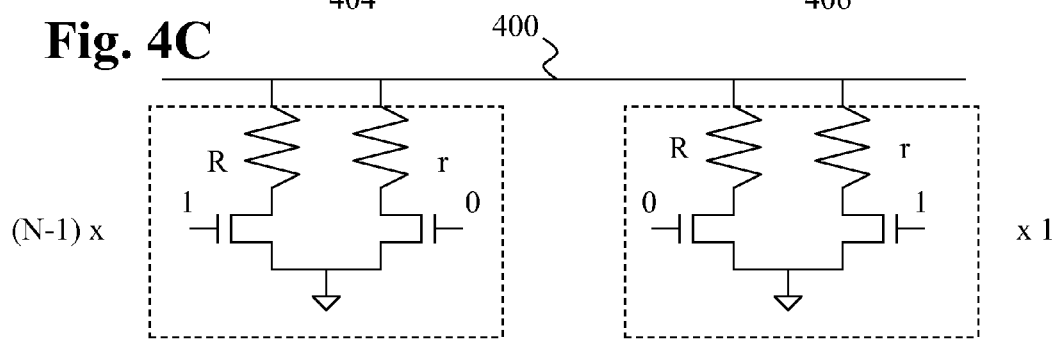

FIGS. 4A-4C, respectively, show a configuration of the lowest resistance match on a match line 400, a reference line 402, and a highest resistance non-match on a match line 400. In particular, the lowest possible resistance for a match on match line 400 exists when all of the cells store an X value and there are no X's applied on the select lines. That is, both memory elements have a high resistive state R and the select lines have, respectively, a 1 and 0 applied as shown in FIG. 4A. Of course, the values on the select lines could be reversed. Assuming that there are N bits (i.e., N cells coupled to the match line) in each word, the effective resistance of the match line 400 is $R_{eff}=R/N$.

In the above example and those that follow, assume that R=2M ohms, r=20K ohms, the data word is 32 bits wide (N=32). Given these assumptions, $R_{eff}$ is approximately equal to 63K ohms.

In FIG. 4C an example of the highest resistance non-match connected to the match line 400 is shown. Such a condition may occur, for example, when all cells store a 1/0 and a single mismatch occurs. Such an example could occur resulting in N−1 cells showing a resistance of R and one cell showing a resistance of r. The effective resistance of the match line 400 in this configuration is $R_{eff}=R/(N-1) \| r$ where $\|$ indicates that a calculation of the two resistors in parallel is to be performed. Utilizing the values shown above, $R_{eff}$ in this configuration may be about 15K ohms.

Reference is now made to FIG. 4B. As discussed above, forming a reference match line 402 that has a resistance between the two conditions shown in FIGS. 4A and 4C may be used to create a timing signal that differentiates between the two states. Accordingly, a reference match line 402 may be created with a resistance between the two. Such a match line may be coupled a plurality of first cells 404 and a plurality of second cells cell 406. Of course, the configuration could be different than that shown in FIG. 4B. For example, some or all of the memory elements could have an r resistive state rather than the R resistive state shown in FIG. 4B. The example in 4B, accordingly, is exemplary only and is utilized in this disclosure because of the ease of calculation.

The effective resistance of the reference match line 402 is equal to $R/(2(N-k))$. Selecting a value of k that places the effective resistance between those of shown with respect to FIGS. 4A and 4C. If, for example, k=13, $R_{eff}$ for the reference match line 402 may be about 39K ohms.

As discussed generally above, the value of R and r may vary with operating voltage or other factors. Because the match line 402 is constructed of the same materials as the CAM and, in one embodiment, is formed on the same chip as the CAM, its resistance varies in the same manner as the resistances seen in the match line 400.

Figure 5:
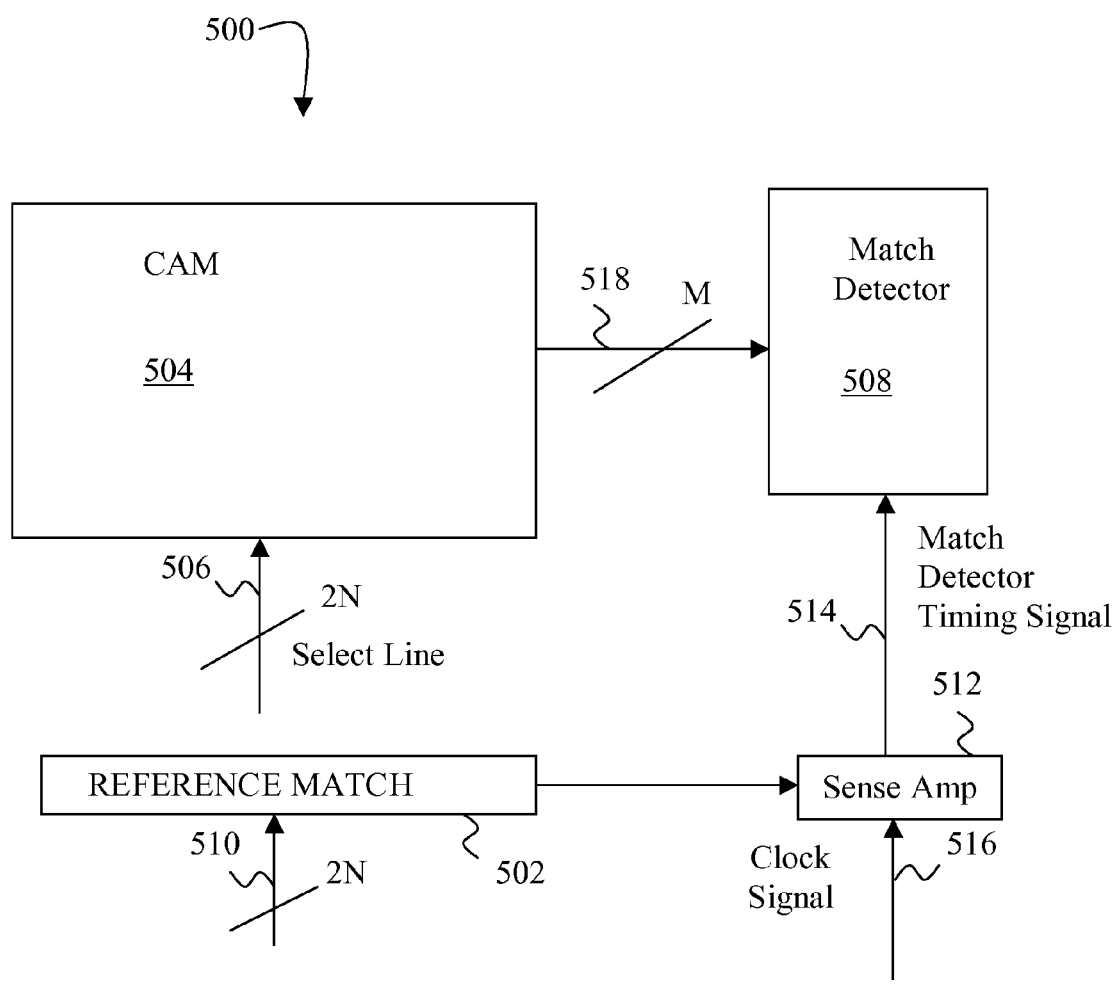
FIG. 5 shows a system according to one embodiment of the present invention.

FIG. 5 shows a system 500 that includes a reference match line 502. The reference match line 502 may be constructed on the same chip as the CAM 504. The CAM 504 is coupled to select lines 506. In one embodiment, the CAM 504 is N bits wide and receives 2N select lines.

The reference match line 502 may be constructed as described above. The reference match line 502 is coupled to and receives inputs from reference select lines 510. The reference select lines 510 may include 2N lines. Of course, the values applied to the reference select lines 510 may be predetermined to create the desired reference match line 502 resistance. Of course, in one embodiment, the values on the reference select lines 510 may be varied in real time if operating conditions need to be varied.

It shall be understood, however, that the number of reference select lines may be minimized in one embodiment. In this embodiment, to reduce the number of reference lines 510 to the reference match line 502, the reference match lines may be encoded to inputs such as 32, 16, 8, 4, 2, 1. In such a manner, the select lines for each memory cell a first group of 2 cells are tied together, select lines for the next 4 cells may be tied together, the select lines for the next 8 cells are tied together, the select lines for the next 16 bits may be tied together and so on. Thus, to select, for example a reference match line with 62 bits, only the $32^{nd}$, $16^{th}$, $8^{th}$, $4^{th}$ and $2^{nd}$ lines would need to be driven to create a 62 bit wide reference match line. This may effectively reduce the number of inputs in, for example, a 64 bit wide match line from 64 to log(64)=6.

The reference match line 502 may be coupled to a sensing circuit that determines when the voltage (or other characteristic) on the reference match line 502 has changed from an initial value to an intermediate value. In one embodiment, each time a value is provided on the select lines 506, the reference match line 502 receives the preselected values on its reference select lines 510.

If, for example, voltage is being measured, the intermediate value may be a fixed percentage of the initial value. When the value has fallen the required amount, a match line sensor 512 may create a match line timing signal 514 which is provided to the match detector 508. Of course, the match line sensor 512 may, in some embodiments, also receive a clock signal 516 that serves to synchronize, generally, the CAM 504 to external elements. The match line sensor 512 may be configured such that the clock signal is not passed to the match detector 508 until the desired conditions of the reference match line 502 have been met. In this manner, variations in resistance (and thus decay times) of the CAM are also experienced by the reference match line 502 and having the reference match line 502 serve as a gating element to provide the clock to the match detector 508 allows for real operating conditions to be tracked. The match detector 508 is coupled to the match lines 518 of the CAM 504. Otherwise, the clocking of the match detector 508 would be based on theoretical timing values that may vary as operating conditions change.

In one embodiment, the reference match line 502 may be formed as part of the CAM 504. In another embodiment, the reference match line 502 may be a separate element as part of a separate array. In such an embodiment, the reference match line 502 may be shared by multiple CAMs. To that end, it shall be understood that modifications to the reference match line output may need to be implemented in order to provide a strong enough output signal to drive multiple sense amps with low latency. One example manner in which this may be accomplished is to replicate the references match line 502 multiple times to form a reference array. Each match line is identically programmed. The multiple match lines may then be logically grouped so that they may drive other CAMs as a group because they have increased drive strength by shorting the inputs and outputs within a group together. In short, the reference array has multiple outputs of variable strength based on the number of match lines shorted together. Of course, each output has the same number of match lines (cells) coupled thereto. The outputs so produced create multiple clock signals used to time operation of the other arrays and have little to no skew between them. Also, by shorting the match lines together, drive strength is increased without increasing latency that would have otherwise been introduced in an effort to increase drive strength and also could have created delays (clock skew) between the output clock signal.

Also, in such an embodiment, the reference match line 502 could include multiple match lines having different resistances for either different CAMs or for sensing different hamming distances. In addition, a delay circuit could be provided between the match detector 508 and the match line sensor 512 to vary the timing of the timing signal 514. This would allow for further modification of the "resistance" of the match line by delaying the signal (i.e., making the match line 502 appear to have a higher resistance because the delay of the signal indicates a slower decay and, thus, higher resistance).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A memory system comprising:
    a content addressable memory (CAM) including a plurality of match lines, each match line having a plurality of memory cells coupled thereto;
    a match detector coupled to the CAM;
    a reference match line having a plurality of reference memory cells coupled thereto, the reference memory cells being of the same type and the memory cells;
    a match line sensor coupled to the reference match line and the match detector that determines a characteristic of the reference match line and provides a timing signal to the match detector based on the characteristic.

2. The system of claim 1, wherein the CAM is a ternary CAM.

3. The system of claim 1, wherein the CAM is coupled to 2N select lines and the reference match line is coupled to 2N reference select line.

4. The system of claim 3, wherein the CAM stores data words that are N bits long.

5. The system of claim 1, wherein the reference match line includes N memory cells, each memory cell including two resistive memory elements.

6. The system of claim 5, wherein the CAM includes M rows of N memory cells and each memory cell includes two resistive memory elements.

7. The system of claim 6, wherein the resistive memory elements are formed of a phase change material.

8. The system of claim 1, wherein the characteristic is a voltage.

9. The system of claim 1, wherein the characteristic is a current.

10. The system of claim 1, wherein the reference match line is formed as part of the CAM.

11. The system of claim 1, further comprising:
    a secondary CAM coupled to the match line sensor.

12. A method of operating a content addressable memory (CAM), the method comprising:
    providing a search string to the CAM;
    providing a reference value to a reference match line;
    monitoring a characteristic of the reference match line; and
    sampling the CAM after the characteristic meets a predetermined value.

13. The method of claim 12, wherein the search string and the reference value are provided at substantially the same time.

14. The method of claim 12, wherein the reference match line is formed of the same materials as the CAM.

15. The method of claim 12, wherein the characteristic is a voltage.

16. The method of claim 12, wherein further comprising:
providing a sample signal to the CAM after the characteristic has met the predetermined value.

17. A method of generating a timing signal for a content addressable memory (CAM) by utilizing a reference match line, the method comprising:
determining a first resistance level of the CAM in a first state;
determining a second resistance level of the CAM in a second state;
programming memory cells coupled to the reference match line such that the reference match line has a resistance level between the first resistance level and the second resistance level; and
generating the timing signal when a monitored characteristic of the reference match line meets a predetermined value.

18. The method of claim 17, wherein the first state is a lowest resistance match state and the second state is a highest resistance no match state.

19. The method claim 18, further comprising:
providing a search string to the CAM; and
providing a reference input to the reference match line.

20. The method of claim 19, wherein the search string and the reference input are provided at substantially the same time.

* * * * *